(12) United States Patent
Fu

(10) Patent No.: US 11,569,204 B2
(45) Date of Patent: *Jan. 31, 2023

(54) INPUT OUTPUT FOR AN INTEGRATED CIRCUIT

(71) Applicant: TAIWAN SEMICONDUCTOR MANUFACTURING CO., LTD., Hsin-Chu (TW)

(72) Inventor: Chin-Ming Fu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 271 days.

This patent is subject to a terminal disclaimer.

(21) Appl. No.: 16/995,447

(22) Filed: Aug. 17, 2020

(65) Prior Publication Data

US 2020/0381402 A1    Dec. 3, 2020

Related U.S. Application Data

(63) Continuation of application No. 16/355,256, filed on Mar. 15, 2019, now Pat. No. 10,748,876, which is a continuation of application No. 15/702,610, filed on Sep. 12, 2017, now Pat. No. 10,269,772, which is a continuation of application No. 14/561,256, filed on Dec. 5, 2014, now Pat. No. 9,773,754.

(60) Provisional application No. 61/912,741, filed on Dec. 6, 2013.

(51) Int. Cl.
| | |
|---|---|
| *H01L 25/065* | (2006.01) |
| *G06F 30/39* | (2020.01) |
| *H01L 23/00* | (2006.01) |
| *H01L 23/60* | (2006.01) |
| *G06F 30/392* | (2020.01) |

(52) U.S. Cl.
CPC .......... *H01L 25/0657* (2013.01); *G06F 30/39* (2020.01); *G06F 30/392* (2020.01); *H01L 23/00* (2013.01); *H01L 23/60* (2013.01)

(58) Field of Classification Search
CPC ..... H01L 25/0657; H01L 23/00; H01L 23/60; G06F 30/39; G06F 30/392
See application file for complete search history.

(56) References Cited

U.S. PATENT DOCUMENTS

| | | |
|---|---|---|
| 5,824,570 A | 10/1998 | Aoki |
| 7,913,202 B2 | 3/2011 | Bernstein |
| 8,060,843 B2 | 11/2011 | Wang |
| 8,140,297 B2 | 3/2012 | Bartley |
| 8,405,442 B2 | 5/2013 | Chen |
| 8,436,671 B2 | 5/2013 | Chern et al. |
| 8,448,100 B1 | 5/2013 | Lin et al. |
| 8,610,488 B2 | 12/2013 | Yu et al. |
| 8,625,240 B2 | 1/2014 | Chung et al. |
| 8,631,372 B2 | 1/2014 | Yu et al. |
| 8,669,780 B2 | 3/2014 | Chi |
| 8,701,073 B1 | 4/2014 | Fu et al. |

(Continued)

*Primary Examiner* — Stacy Whitmore
(74) *Attorney, Agent, or Firm* — Duane Morris LLP

(57) ABSTRACT

A three-dimensional integrated circuit has a plurality of layers disposed in a stacked relationship. Logic circuitry is embodied in a first layer of the three-dimensional integrated circuit. An input output circuit is electrically coupled to the logic circuitry and has a plurality of transistors embodied in at least two layers of the three-dimensional integrated circuit. The input output circuit has first and second input output circuitry, wherein the first input output circuitry operates faster than the second input output circuitry.

21 Claims, 14 Drawing Sheets

(56) References Cited

U.S. PATENT DOCUMENTS

| | | |
|---|---|---|
| 8,754,818 B2 | 6/2014 | Yen et al. |
| 8,847,659 B1 | 9/2014 | Lan et al. |
| 8,896,094 B2 | 11/2014 | Yen et al. |
| 9,016,939 B2 | 4/2015 | Chang et al. |
| 9,021,414 B1 | 4/2015 | Or-Bach |
| 9,086,452 B2 | 7/2015 | Wang et al. |
| 9,165,968 B2 | 10/2015 | Chao et al. |
| 9,171,798 B2 | 10/2015 | Lin et al. |
| 9,172,242 B2 | 10/2015 | Chang et al. |
| 9,197,199 B2 | 11/2015 | Huang et al. |
| 9,214,933 B2 | 12/2015 | Chern et al. |
| 9,219,038 B2 | 12/2015 | Horng et al. |
| 9,412,645 B1 | 8/2016 | Or-Bach |
| 2008/0163146 A1 | 7/2008 | Wu |
| 2008/0237591 A1 | 10/2008 | Leedy |
| 2008/0251941 A1 | 10/2008 | Leedy |
| 2008/0282216 A1 | 11/2008 | Bansal |
| 2009/0319968 A1 | 12/2009 | Wang |
| 2011/0309468 A1 | 12/2011 | Oh |
| 2012/0036489 A1 | 2/2012 | Wang |
| 2012/0304138 A1 | 11/2012 | Farooq |
| 2013/0009324 A1 | 1/2013 | Bartley |
| 2013/0193981 A1 | 8/2013 | Chen et al. |
| 2013/0198706 A1 | 8/2013 | Mehta |
| 2013/0246990 A1 | 9/2013 | Yen et al. |
| 2013/0320553 A1 | 12/2013 | Kuo et al. |
| 2014/0021639 A1 | 1/2014 | Leedy |
| 2014/0126274 A1 | 5/2014 | Lee et al. |
| 2014/0167799 A1 | 6/2014 | Wang et al. |
| 2014/0195728 A1 | 7/2014 | Hsu et al. |
| 2014/0239427 A1 | 8/2014 | Huang et al. |
| 2014/0266273 A1 | 9/2014 | Wang et al. |
| 2015/0221592 A1 | 8/2015 | Verma |

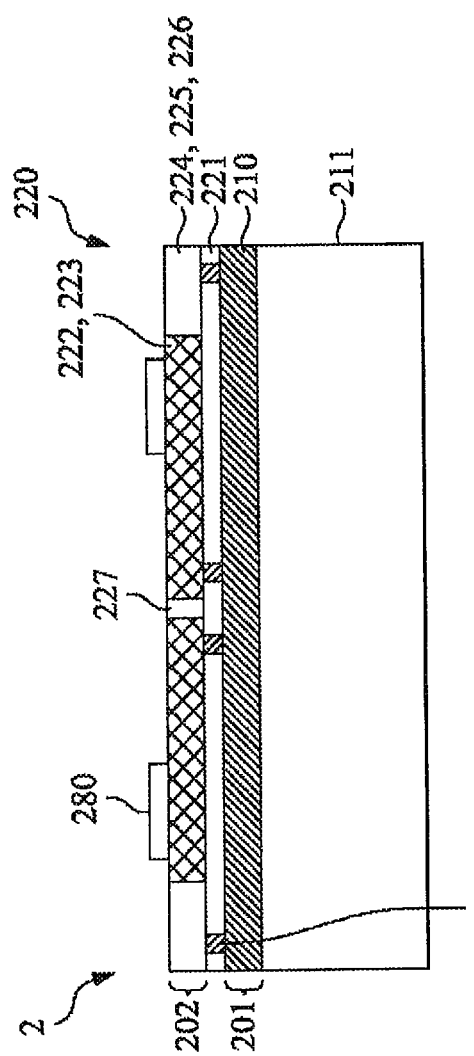
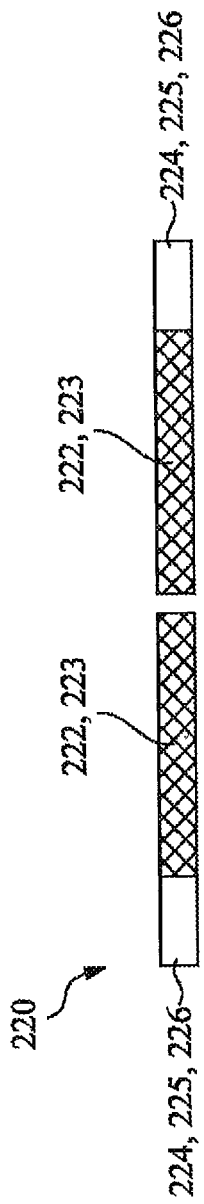

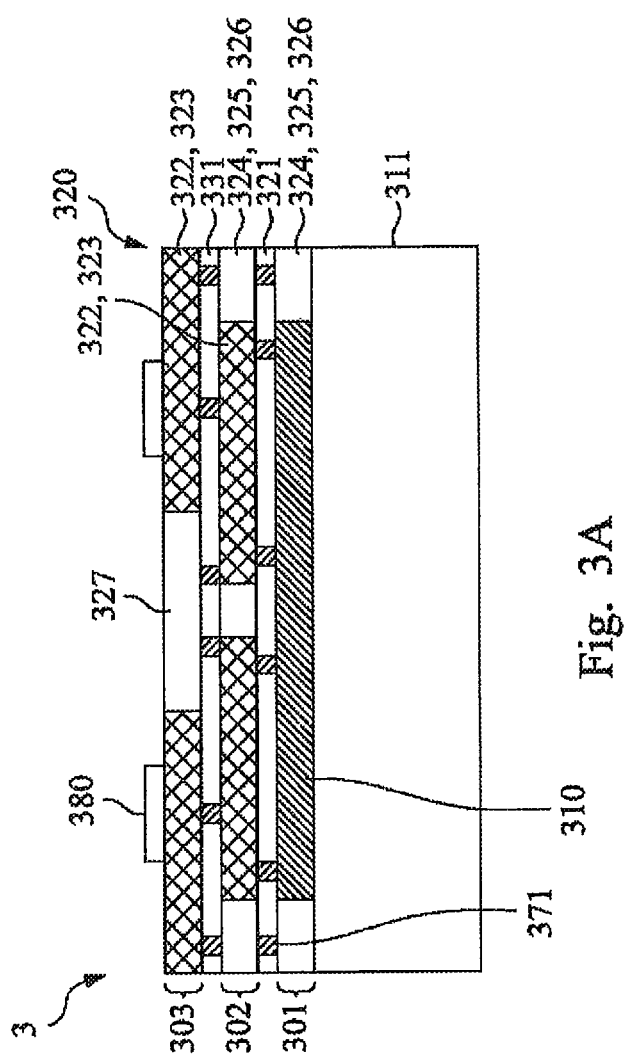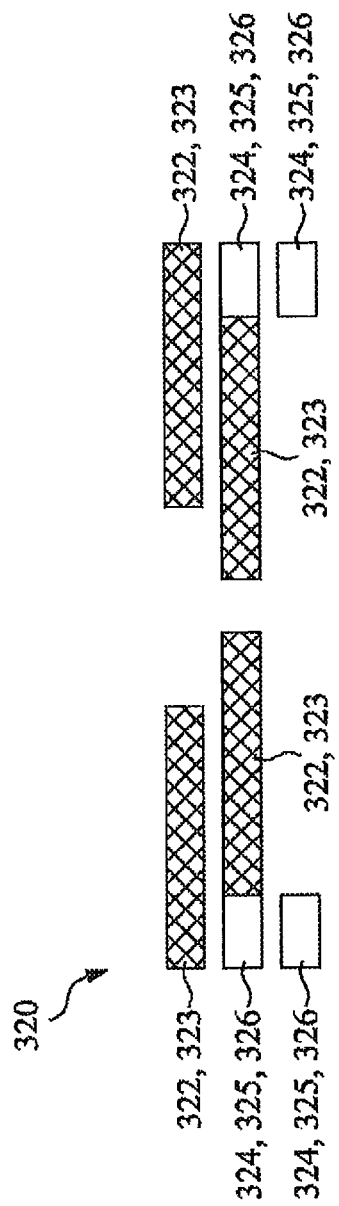

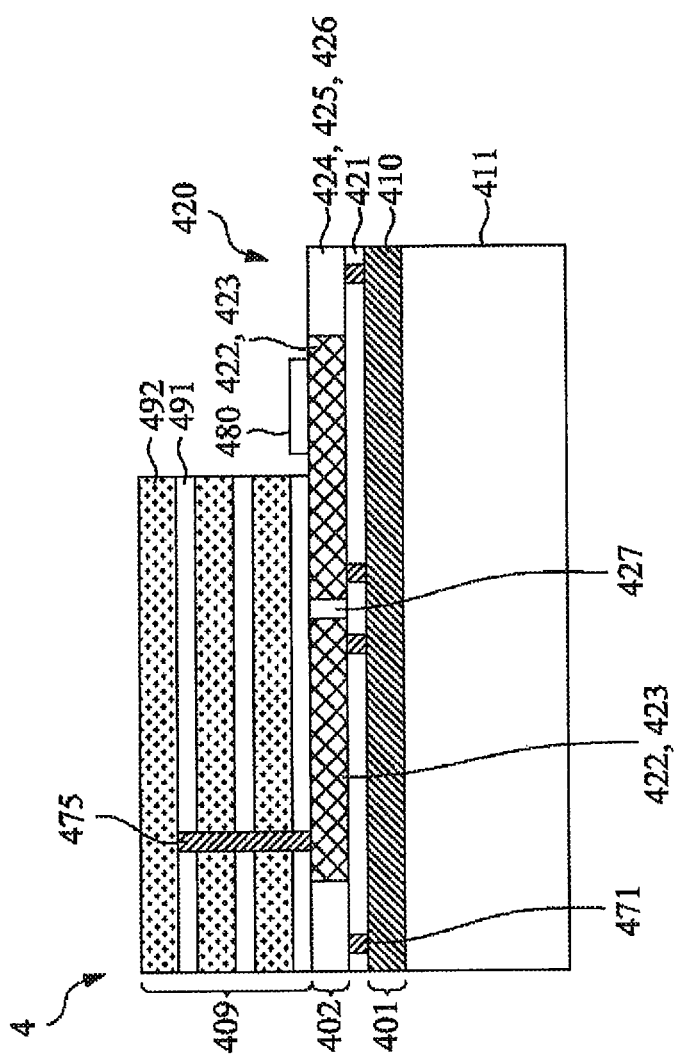
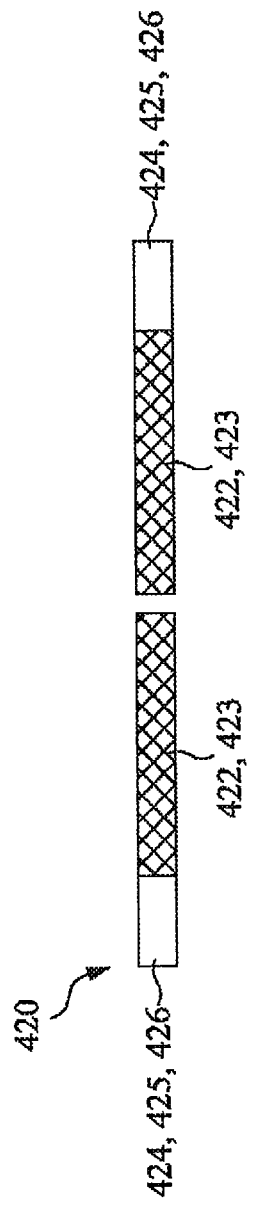
Fig. 4A
Fig. 4B

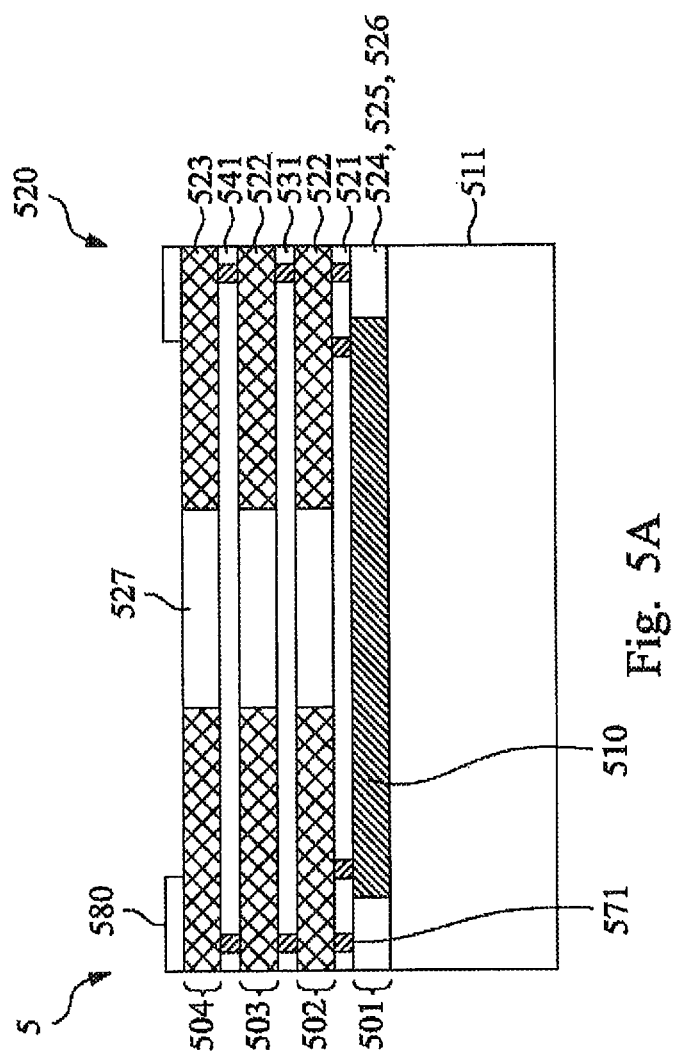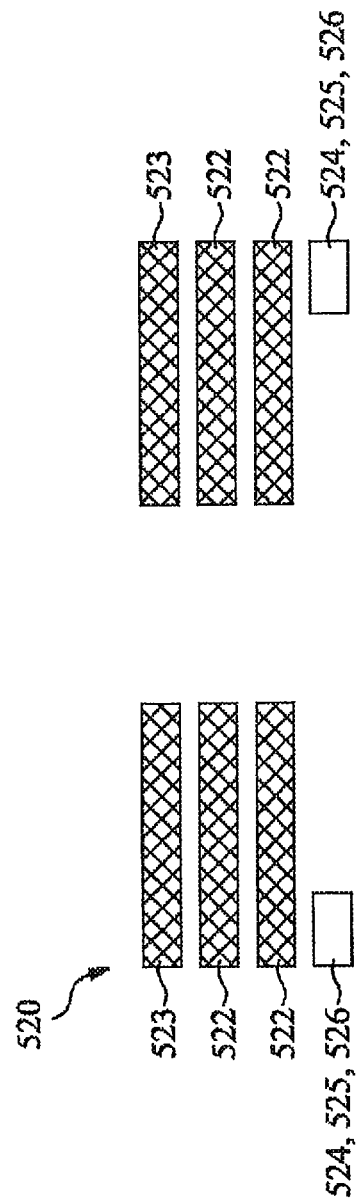

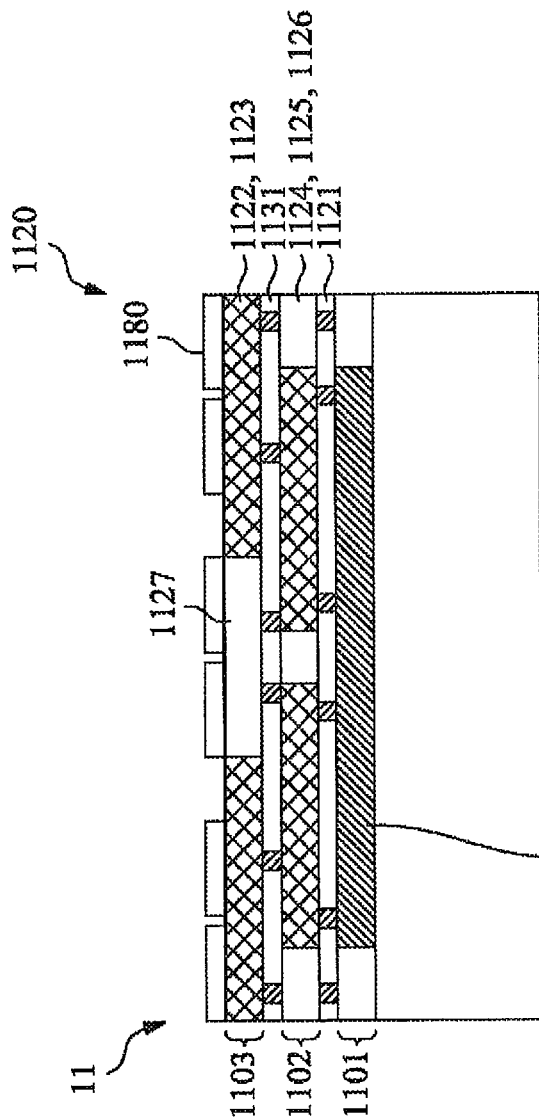
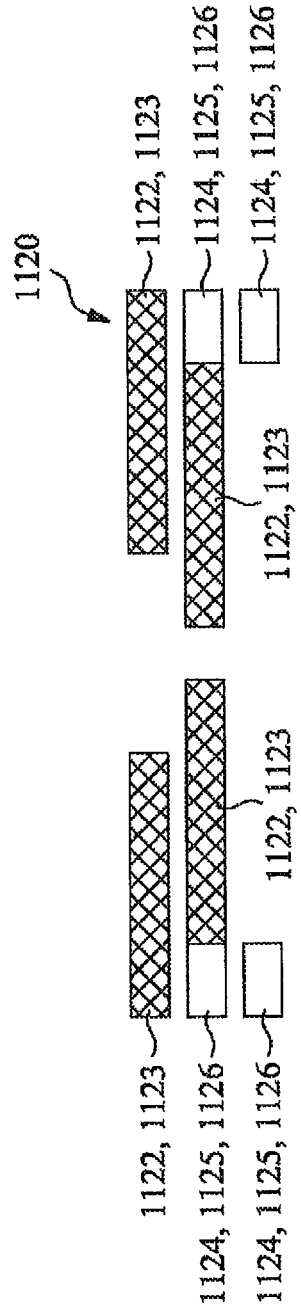
Fig. 11A
Fig. 11B

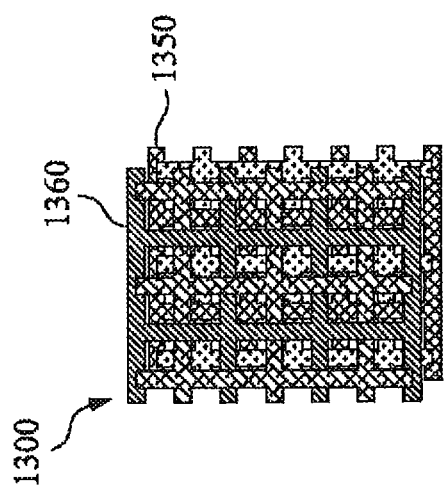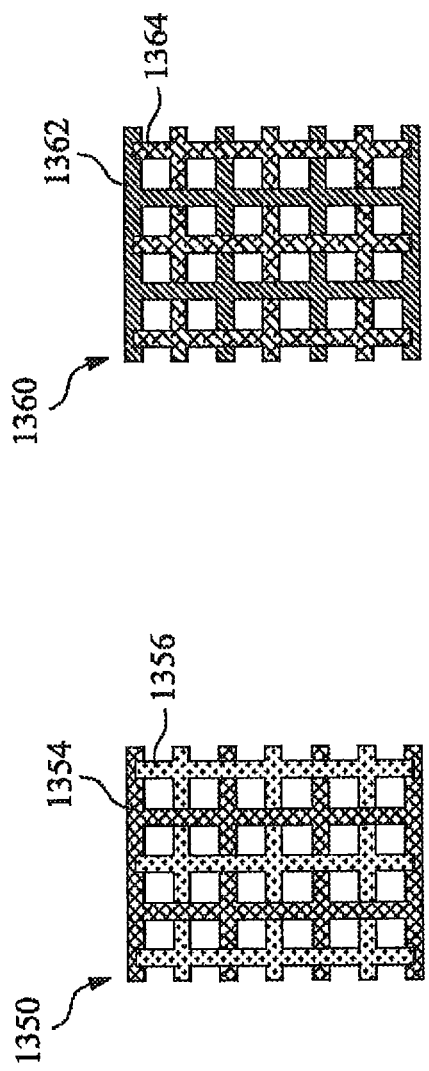

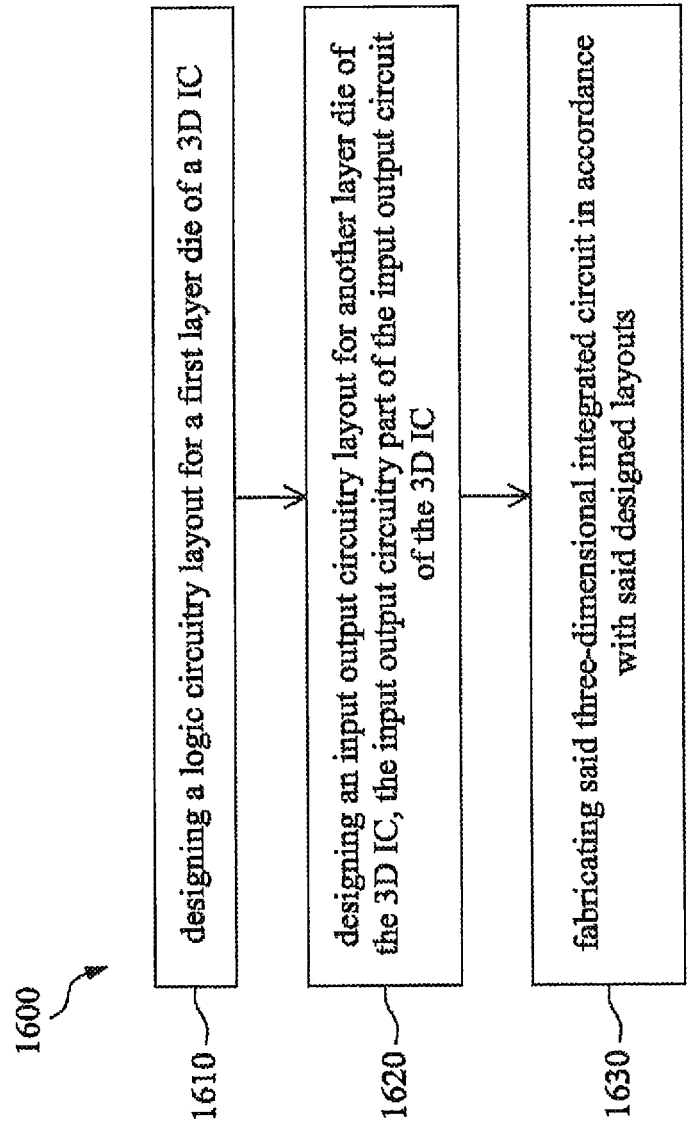

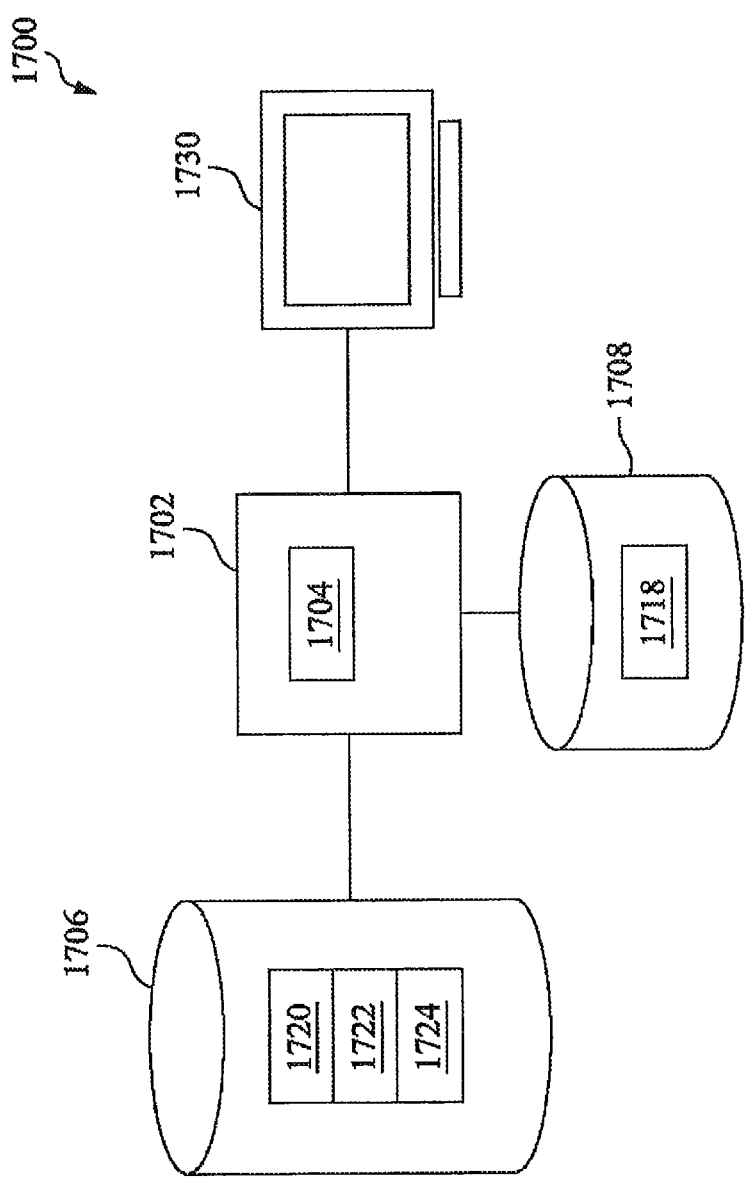

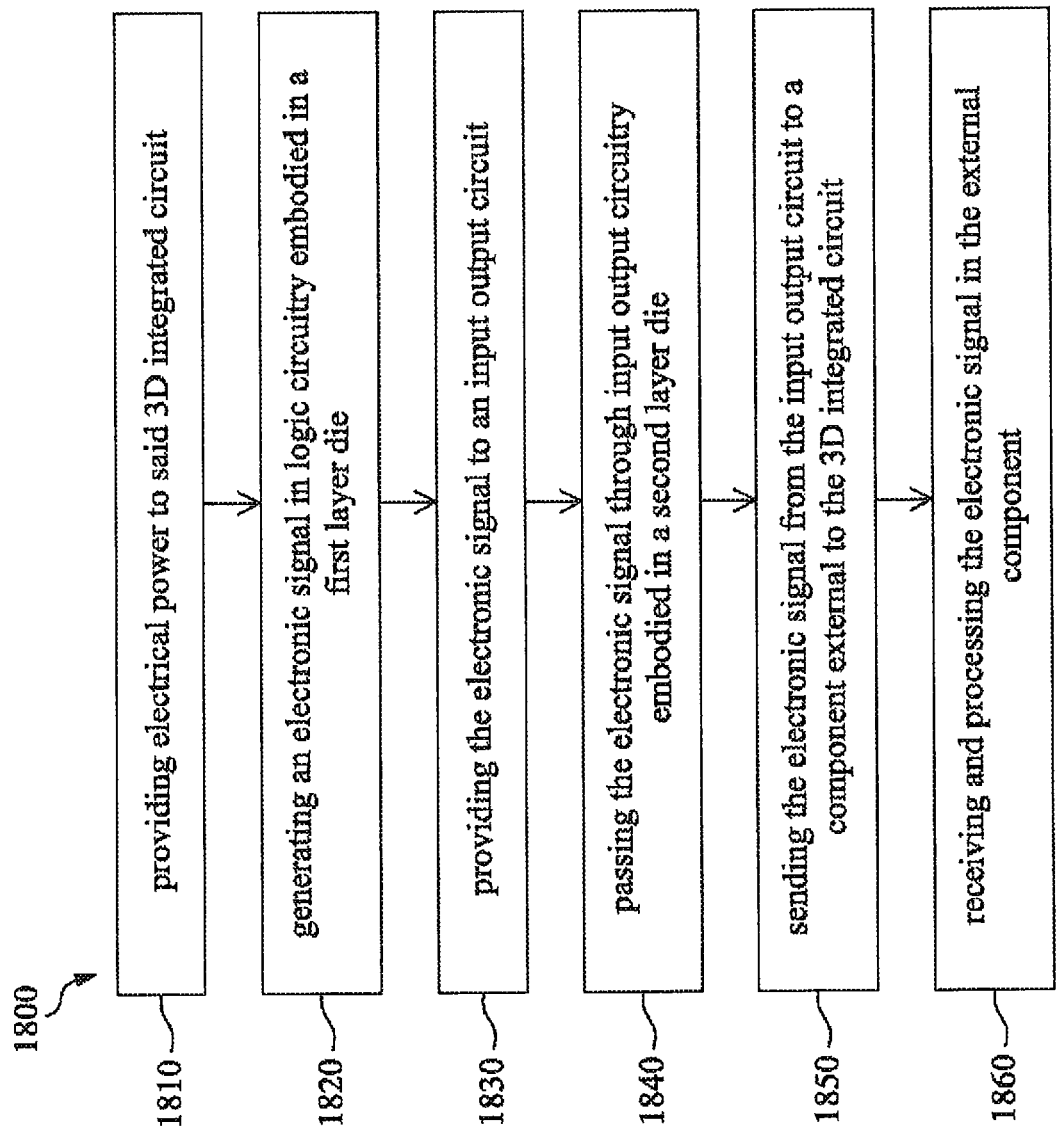

INPUT OUTPUT FOR AN INTEGRATED CIRCUIT

RELATED APPLICATIONS

This application is a continuation of U.S. patent application Ser. No. 16/355,256, fled Mar. 15, 2019, which is a continuation of U.S. patent application Ser. No. 15/702,610, filed Sep. 12, 2017, which is a continuation of U.S. patent application Ser. No. 14/561,256, filed Dec. 5, 2014, which claims the priority benefit of U.S. Provisional Application No. 61/912,741, filed Dec. 6, 2013, entitled INPUT OUTPUT FOR AN INTEGRATED CIRCUIT, the entirety of each of which are hereby incorporated by reference.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node). As device dimensions shrink, voltage nodes also shrink, with modern core device voltages trending toward less than 1 Volt, and input/output (I/O) device voltages under 2 Volts.

A semiconductor process node can be specified by size (for example 40 nm, 28 nm, 16 nm, etc.), where a smaller size has a higher gate density and denotes a more advanced process node. A given process node typically specifies parameters of its core devices and one or more types of I/O devices. The core devices and I/O devices are characterized by parameters such as maximum power and ground voltage levels, maximum load current, gate density, speed, etc.

There can be further differences between process nodes of a give size (e.g., 20 nm), such as various process nodes adapted for low power (LP), high performance (HP), a low power with high-k metal gates (HPL) or high performance for mobile applications (HPM), for example. While a more advanced process node may have many important advantages, such as speed and size, those advances can come with challenges. For example, as the process node becomes more advanced, circuit design may have to account for one or more challenges, such as reduced reliability, gates and interconnections with a lower maximum load current due to electromigration ("EM") concerns, increased sensitivity to electrostatic discharge, and/or increased leakage, for example. In some approaches, resistor EM may degrade by about 0.1 mA/µm from a mature process node to a more advanced process node, such as a process node with a higher gate density.

In common electronic devices, higher power components such as analog or radiofrequency ("RF") circuits typically interface with a higher density integrated circuit located on a separate wafer. The wafer can have logic circuitry that forms a high speed digital circuit, such as digital logic for a microprocessor, a standard cell, SRAM or digital phase locked loop (PLL), for example. This logic circuitry is typically implemented using core devices. An input/output ("I/O") circuit on the wafer is typically used to couple signals between the logic circuitry (also referred to herein simply as logic) and electronic components external to the wafer, such as the analog or RF circuits mentioned above. As is known, I/O circuits perform their function using I/O circuitry, including primitives such as: a level-shifter circuit, a pre-driver circuit, a post-driver circuit, a receiver circuit, an electrostatic discharge protection circuit ("ESD"), etc. The I/O circuitry is typically implemented using transistors of one of the I/O device types specified for the process node used.

In one approach, the logic and I/O circuit are disposed on a substrate, with the logic centrally located on the wafer. Outward of the logic is the receiver, pre-driver, and level shifter circuits. Outward of those components is the post-driver and ESD protection circuit. Disposed on top of the post-driver and ESD protection circuit are pads for electrical connection to components external to the wafer. The wafer is implemented at a particular process node.

It can be desirable to improve a given logic circuit by using a more advanced process node for a wafer, for example a node having a higher gate density. Generally, however, using a more advanced process node does not improve the I/O circuit to the same extent as the logic. If the advanced process node has reduced EM or ESD resilience compared to a more mature process node, for example, that will constrain the shrink factor of the post-driver and ESD protection circuit when attempting to implement those circuits on the more advanced process node. To provide the requisite protections for electrostatic discharge and EM, it can be necessary to change the architecture of the post-driver and ESD protection circuits.

BRIEF DESCRIPTION OF THE DRAWINGS

The following will be apparent from elements of the figures, which are provided for illustrative purposes only and are not necessarily to scale.

FIG. 2A is an elevation diagram of a second embodiment for a three-dimensional integrated circuit having an I/O circuit.

FIG. 2B is an elevation diagram of the I/O circuit shown in FIG. 2A.

FIG. 3A is an elevation diagram of a third embodiment for a three-dimensional integrated circuit having an I/O circuit.

FIG. 3B is an elevation diagram of the I/O circuit shown in FIG. 3A.

FIG. 4A is an elevation diagram of a fourth embodiment for a three-dimensional integrated circuit having an I/O circuit.

FIG. 4B is an elevation diagram of the I/O circuit shown in FIG. 4A.

FIG. 5A is an elevation diagram of a fifth embodiment for a three-dimensional integrated circuit having an I/O circuit.

FIG. 5B is an elevation diagram of the I/O circuit shown in FIG. 5A.

FIG. 11A is an elevation diagram of a seventh embodiment for a three-dimensional integrated circuit having an I/O circuit.

FIG. 11B is an elevation diagram of the I/O circuit shown in FIG. 11A.

FIG. 13 is a plan diagram showing an example power and ground mesh layout for a lower layer of the embodiment shown in FIG. 2.

FIG. 14 is a plan diagram showing an example power and ground mesh layout for an upper layer of the embodiment shown in FIG. 2.

FIG. 15 is a top perspective view showing example overlay between the mesh layouts shown in FIGS. 13 and 14.

FIG. 16 is a flow diagram showing process steps for making some embodiments of a three-dimensional integrated circuit.

FIG. 17 is a block diagram of a system for performing methods according to some embodiments.

FIG. 18 is a flow diagram showing process steps for operating some embodiments of a three-dimensional integrated circuit.

DETAILED DESCRIPTION

This description of certain exemplary embodiments is intended to be read in connection with the accompanying drawings, which are to be considered part of the entire written description. Terms and depictions concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms and depictions concerning electrical coupling and the like, such as "coupled," "connected" and "interconnected," refer to a relationship wherein structures communicate with one another either directly or indirectly through intervening structures unless expressly described otherwise. Similarly, terms and depictions concerning connection points in a circuit such as "pad", "rail", or "terminal" should be understood as inclusive of all forms of electronic connection and are not limited to a physically identifiable pad, rail, or terminal unless expressly described otherwise. Like reference numbers in the figures denote like components, and for brevity, descriptions will not be unnecessarily repeated for subsequent figures.

Figure 1A:
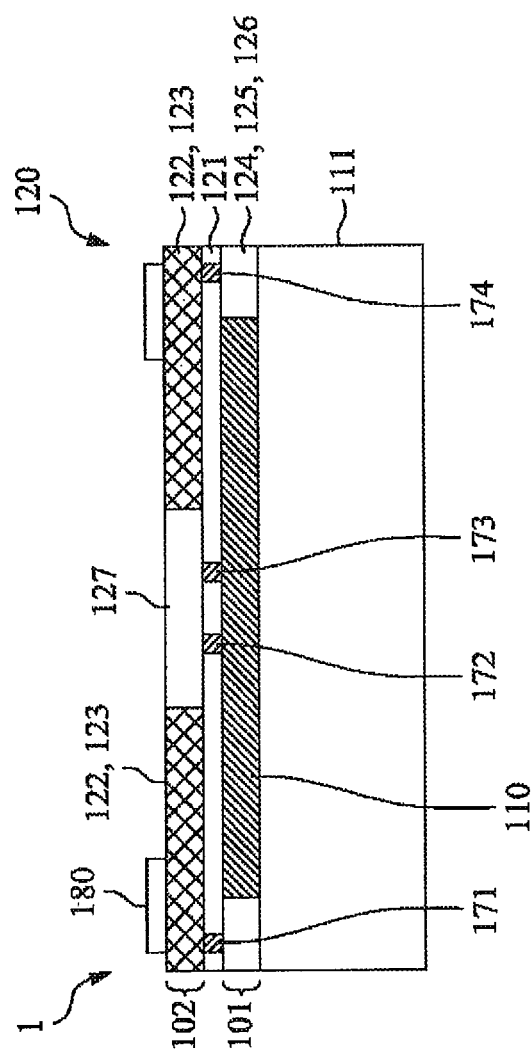
FIG. 1A is an elevation diagram of a first embodiment for a three-dimensional integrated circuit having an I/O circuit.

FIG. 1A shows a first embodiment of three-dimensional integrated circuit ("3d IC") 1. 3d IC 1 is formed from a layer die 101 and a layer die 102 disposed in a stacked relationship relative to each other. Stacked layer dies 101, 102 can also be referred to as a stack of dies or chips. Electronic components of layer dies 101, 102 are interconnected by interconnections 171, 172, 173 and 174, which in some embodiments may be through-silicon vias ("TSVs"). A TSV is a conductive via that runs vertically through a silicon chip and electrically connects structures, for example, on the top side and the bottom side of the chip. Various methods of interconnections can be used in combination with, or instead of, TSVs.

Layer die 101 is embodied in semiconductor material disposed on substrate 111. In some embodiments, layer die 101 includes logic 110 and the following I/O circuitry: receiver circuit 124, level shifter circuit 125 and pre-driver circuit 126. Layer die 102 is embodied in semiconductor material disposed on substrate 121. In some embodiments, layer die 102 includes decoupling capacitive device 127 and the following I/O circuitry: post-driver 122 and ESD protection circuit 123.

Decoupling capacitive device 127 can be used to decouple one part of the electrical circuit from another. Noise caused by other circuit elements can be shunted through the capacitive device, reducing the effect of the noise on the rest of the circuit. In some embodiments, one or more decoupling capacitive devices are disposed between power and ground to provide local energy storage and maintain power supply voltage. Some embodiments do not have a decoupling capacitive device.

Figure 1B:
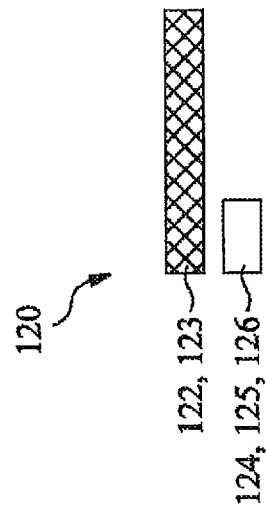
FIG. 1B is an elevation diagram of the I/O circuit shown in FIG. 1A.

In the embodiment of FIG. 1A, I/O circuit 120 includes the I/O circuitry previously described: receiver 124, level shifter circuit 125, pre-driver circuit 126, post-driver circuit 122 and ESD protection circuit 123. For clarity, FIG. 1B shows the I/O circuit 120 without the remaining components of 3d IC 1 shown in FIG. 1A. Thus, I/O circuit 120 has circuitry embodied in both layer die 102 and layer die 101. Pads 180 are disposed on layer die 102 and provide electrical coupling to the I/O circuit 120.

A die in the stack can be a separated part of a wafer intended to perform a function or functions in a device. In some embodiments, layer die 101 is a more advanced process node than layer die 102. For example, in some embodiments, layer die 101 is a more advanced process node because it has a higher gate density than layer die 102. In other embodiments, layer die 101 is a more advanced process node in other respects, such as higher speed, lower power, or optimization for a particular use, etc.

In some embodiments, logic 110 and at least some of the I/O circuitry 124, 125, 126 embodied in layer die 101 are implemented using core devices. In some embodiments, the core devices have thin oxide transistors that can be used with higher speed, lower voltage supply and/or smaller size as compared to the thicker oxide transistors typically used for I/O devices. In some embodiments, the circuitry in layer die 102 is not implemented using core devices, which can result in advantages such as reducing the cost of second layer die 102.

By including part of I/O circuit 120 in layer die 102 as taught herein, certain advantages can be achieved. One advantage is lateral spacing. Post-driver 122 and ESD protection circuit 123 can occupy a majority of the area of I/O circuit 120. In certain layouts, post-driver 122 and ESD protection circuit 123 can make up 60 to 80 percent of the area of I/O circuit 120. Thus, disposing Post-driver 122 and/or ESD protection circuit 123 on a layer stacked over layer die 101 can result in significant savings in lateral space.

Another advantage of disposing at least a part of I/O circuit 120 on a separate layer as taught herein is the ability to utilize different process nodes. For example, in some embodiments, post-driver 122 and ESD protection circuit 123 maintain a high level of performance for one or more of the following criteria: a sufficient margin of current density to protect against EM, sufficient resilience against electrostatic discharge, the elimination or sufficiently minimized latch up phenomena, minimized leakage and sufficiently maintained input/output capacitance. Such requirements can make post-driver 122 and/or ESD protection circuit 123 more suitable for a more mature process node, such as one with a lower gate density. By disposing post-driver 122 and ESD protection circuit 123 on layer die 102, those circuits can benefit from use of a more mature process node, while freeing layer die 101 to be implemented on a different process node, such as one with next-generation gate densities.

For example, by splitting the I/O circuit onto different layers, the I/O circuit 120 can be faster. Receiver circuit 124, level shifter circuit 125, and pre-driver circuit 126 of I/O circuit 120 can have a significant impact on the overall speed of input output performance. As a result, implementing those portions of I/O circuit 120 on layer die 101 that uses a process node having higher speed can realize overall speed improvements for I/O circuit 120.

In some embodiments, the I/O circuitry design has further advantages in portability and re-usability when designing new circuits. For example, when creating a new design using a previous design for all or a portion of 3d IC 1, it may be desirable to port the circuitry disposed on layer die 101 (logic 110, receiver circuit 124, level shifter circuit 125, and pre-driver circuit 126) to a more advanced process node, such as a process node having a higher gate density, than the process node used in the previous design, while keeping the process node of layer 102 the same as previously used. As a result, aspects of the design for layer die 102 can be simply reused or modified, while aspects of the design for layer die 101 can be migrated to a more advanced process node. Similarly, a next generation product can be developed by porting logic 110 to a next-generation process node in a manner that might not otherwise be possible, for example, if post-driver 122 or ESD protection circuit 123 were disposed on the same layer die as logic 110.

In several of the figures, including FIG. 1A, a layer die includes semiconductor material and a substrate. In some embodiments, the layer die does not have a substrate. In several of the figures, including FIG. 1A, layer die 101 and layer die 102 are contiguous. In some embodiments, layer dies 101, 102 are part of a multi-chip structure and can be separated by one or more components, such as further dies. For example, a layer die with other circuitry may be disposed between layer die 101 and layer die 102. In some embodiments, the substrates of the layers have approximately the same thickness; in other embodiments, the thickness of one or more of the substrates differs.

The disclosed embodiments are not limited to a particular 3d IC integration or fabrication technology. For example, 3d IC 1 can be integrated at the wafer level, device level, or some other 3d IC integration technique. Using device-level, vertical integration techniques, the transistors making up layer 102 can be fabricated sequentially on top of the transistors of layer 101. In some embodiments, a thin substrate 121 provides electrical insulation between the active devices of adjacent layers 101, 102. A layer and its substrate, such as layer 102 and substrate 121 is also commonly referred to as a tier. Tiers can be bonded or otherwise directly integrated with each other in a stacked relationship during fabrication. In such embodiments, interconnections 171, 172, 173, and 174 can include any known method of interconnection, such as using inter-tier vias or inter-level vias, ILVs.

FIG. 2A shows an embodiment of 3d IC 2 formed from a layer die 201 and a layer die 202. Layer die 201 embodies logic 210. 3d IC 2 includes I/O circuit 220. The input/output circuitry of I/O Circuit 220 includes receiver 224, level shifter circuit 225, pre-driver circuit 226, post-driver circuit 222 and ESD protection circuit 223. For clarity, FIG. 2B shows I/O circuit 220 without the remaining components of 3d IC 2 shown in FIG. 2A. All of I/O circuit 220 is embodied in layer die 202. Receiver circuit 224, level shifter circuit 225 and pre-driver circuit 226 are embodied in layer die 202 outward of post-driver circuit 222 and ESD protection circuit 223. In some embodiments, layer die 201 can be a more advanced process node than layer die 202. For example, in some embodiments, layer die 201 has a higher gate density than layer die 202. In some embodiments, because I/O circuit 220 is not included on layer die 201, I/O circuit 220 is not exposed to the more challenging EM and ESD characteristics that can be associated with a higher gate density, or otherwise more advanced, process node, of layer die 201. Conversely, the design of layer die 201 is not constrained to the EM and ESD characteristics required by I/O circuitry. Furthermore, in some embodiments, because I/O circuit 220 is not included on layer die 201, the transistors of layer die 201 can be implemented using core devices. As a result, smaller sizes and costs can be achieved. In embodiments in which I/O circuit 220 is not included on layer die 201, logic 210 can be ported to a next generation process node in a manner that might not otherwise be possible if circuitry of IO circuit 220 were present on layer die 201.

Advantageously, in some embodiments, layer die 202 and/or I/O circuit 220 have a functional or physical layout design that is easily portable so that the design can be reused with new and different logic circuitry 210. For example, the I/O circuit 220 can be a standard design that was developed independent of 3d IC 2. In such embodiments, layer die 202 (or I/O Circuit 220), can be a standard, pre-designed circuit element that can be reused for new 3d IC designs. For example, the circuitry on layer die 201 could be improved to a new, advanced process node, such as a process node having a higher gate density, without redesigning the circuitry on layer die 202. In some embodiments, the standard, pre-designed I/O circuitry is re-used without adaptation for use in the new 3d IC. In some embodiments, minor adaptations within the skill of a person of ordinary skill in the art can be made to conform the pre-designed I/O circuitry to the particular requirements of the new 3d IC.

FIG. 3A shows an embodiment of 3d IC 3 made of layer die 301, 302 and 303. I/O circuit 320 has I/O circuitry on each of the stacked layer dies. For clarity, FIG. 3B shows I/O circuit 320 without the remaining components of 3d IC 3 shown in FIG. 3A. The I/O circuitry of I/O circuit 320 includes receiver 324, level shifter circuit 325, pre-driver circuit 326, post-driver circuit 322 and ESD protection circuit 323. I/O circuitry receiver 324, level shifter circuit 325, pre-driver circuit 326 are disposed on layer dies 301 and 302. I/O circuitry post-driver circuit 322 and ESD protection circuit 323 are disposed on layer dies 302 and 303. The layer dies may be implemented using any combination of process nodes, each of which can be selected to best suit the functionality of the circuitry disposed on a particular layer die.

For example, in some embodiments, layer die 301 is implemented using a process node having a higher gate density that is more suitable for logic 310 and the components of the receiver circuit 324, level shifter circuit 325, pre-driver circuit 326 that are on that layer die. Layer die 302 may use a more mature process node that is suitable for I/O functionality embodied in that layer die. For example, in some embodiments, logic 310 can benefit from I/O functionality at two or more data rates to support signals being transferred to and from logic 310 at different speeds. Portions of I/O circuit 320 can be disposed on different layer die according to speed. For example, I/O circuitry on layer die 302 can provide lower speed I/O for logic 310, whereas I/O circuitry on layer die 303 can provide higher speed I/O. For example, low speed I/O from layer die 302 can include general purpose input/output ("GP I/O") functionality, operating in some embodiments at a data rate of less than 100 megabits per second. As a further example, high speed I/O from layer die 303 in some embodiments can operate at data rates of at least about 1-5 gigabits per second. High-speed I/O is useful, for example, in applications such as double data rate fourth generation memory devices like DDR4 SDRAM. By separating the I/O circuitry as taught herein, the process nodes selected for layer dies 302, 303 can be matched to given I/O speed requirements, while the process node for the logic 320 of layer die 301 can be matched to logic 320.

Embodiments provided herein can be compared to an alternative approach (not shown), in which a logic circuit and an I/O circuit are embodied in a single chip, with the logic circuit being about 70 percent, and the I/O circuit being about 30 percent, of that chip's size. In the alternative approach, the post-driver circuit and ESD protection circuit together form about 70 percent of the I/O circuit's chip size. The cost of 3d IC 1 can be approximately 85 to 90 percent of the cost of such an alternative approach. The cost of 3d IC 2 can be approximately 75 percent of the cost of the alternative approach. Thus, provided embodiments of the present disclosure can achieve advantageous cost savings, while permitting the process node of the core logic to be ported to a more advanced process node, such as to a higher gate density process node. In some embodiments, components on a next generation, more advanced process node can be implemented at 25% of the size of the previous process node. As compared to the alternative approach, one can realize the cost savings of using a more advanced process node for layer die 101, 201, 301 etc.

FIG. 4A shows an embodiment of 3d IC 4, which includes layer die 401, layer die 402 and memory stack 409. 3d IC 4 includes I/O circuit 420. The input/output circuitry of I/O Circuit 420 includes receiver 424, level shifter circuit 425, pre-driver circuit 426, post-driver circuit 422 and ESD protection circuit 423. For clarity, FIG. 4B shows I/O circuit 420 without the remaining components of 3d IC 4 shown in FIG. 4A. Memory stack 409 includes stacked memory chips 492 and memory substrates 491. Interconnection 475 interconnects the memory chips 492 with each other and with I/O circuitry post-driver circuit 422 and ESD protection circuit 423. In some embodiments, layer die 402 is a standard, pre-designed component. In some embodiments, layer die 402 combined with memory stack 409 is a standard, pre-designed component. In some embodiments, layer die 402 and memory stack 409 are implemented using the same semiconductor process node. In some embodiments, layer die 402 and/or memory stack 409 can be implemented using a more mature process node than the process node implemented in layer die 401. For example, in some embodiments, layer die 402 and/or memory stack 409 can have a lower gate density than layer die 401. By separating the logic 410 from I/O Circuit 420 and memory stack 409 as taught herein, one can advantageously develop next generation products. For example, a next generation smartphone can be provided by developing new processor circuitry in logic 410 on layer die 401, while maintaining the same I/O Circuit 420 and memory stack 409. In addition, performance verification can be simplified because the memory stack 409 and I/O Circuit 420 can be validated as a unit.

FIG. 5A shows an embodiment of 3d IC 5 having layer dies 501, 502, 503 and 504. 3d IC 5 includes I/O circuit 520. The input/output circuitry of I/O Circuit 520 includes receiver 524, level shifter circuit 525, pre-driver circuit 526, post-driver circuit 522 and ESD protection circuit 523. For clarity, FIG. 5B shows I/O circuit 520 without the remaining components of 3d IC 5 shown in FIG. 5A. ESD protection circuit 523 is embodied in layer die 504, separate from post-driver circuit 522. Post driver circuit 522 is embodied in layer dies 503 and 502. While four layer dies are depicted in FIG. 5A, any number of layers can be utilized according to the purpose of 3d IC and its associated logic. Each layer die can utilize a different process node, or particular layer dies may use the same process node. An advantage of separating ESD protection circuit 523 from other layers as taught herein is that the ESD protection circuit 523 is physically disposed between the surface of 3d IC 5 that has pads 580, which is a potential source of electrostatic discharge, and the circuitry to be protected, which is disposed on the lower layer die 503, 502, 501. The intervening position of ESD protection circuit 523 can assist in providing ESD protection to the remaining circuitry. Another advantage is that because the electrostatic discharge protection function of ESD protection circuit 523 can benefit from a resilient process node, separating the ESD protection circuit 523 as taught herein allows porting layer dies 503, 502, and 501 to more advanced process nodes that might otherwise not be feasible if ESD protection circuit 523 were present on those layers. Another advantage of separating ESD protection circuit 523 to its own layer die is that the design for ESD protection circuit 523 can be a standard building block, separately validated.

Figure 6A:
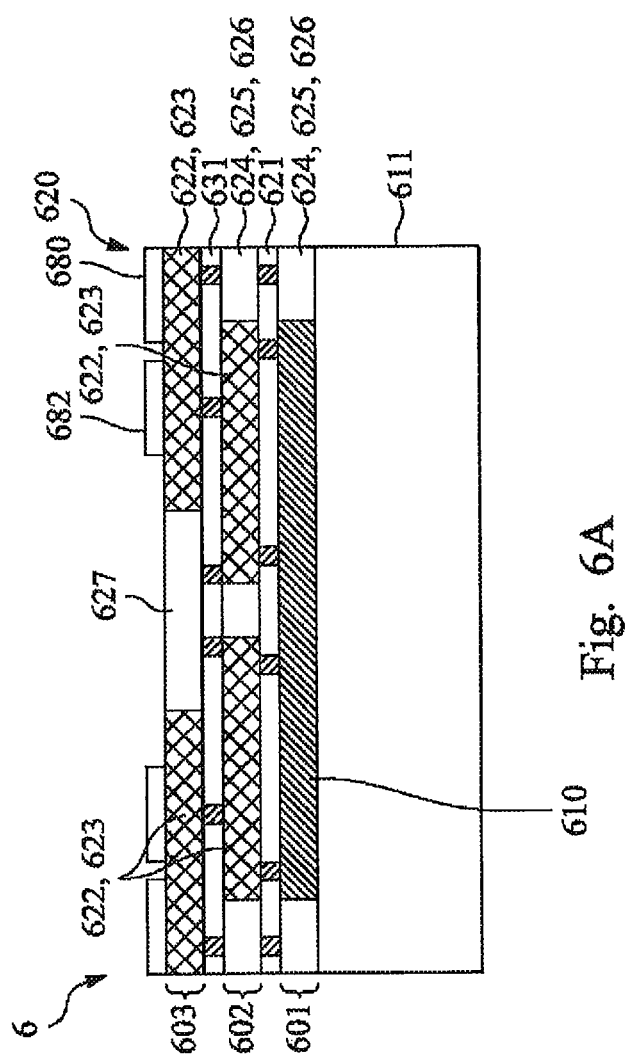
FIG. 6A is an elevation diagram of a sixth embodiment for a three-dimensional integrated circuit having an I/O circuit.
Figure 6B:
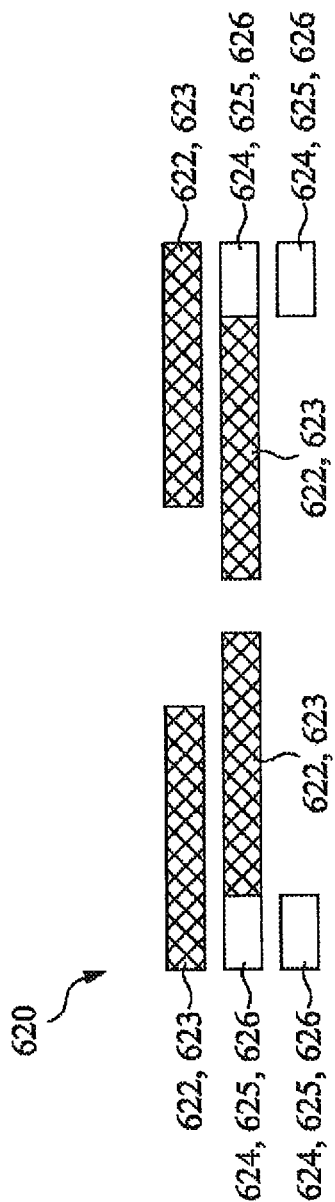
FIG. 6B is an elevation diagram of the I/O circuit shown in FIG. 6A.

FIG. 6A shows an embodiment of 3d IC 6. 3d IC 6 is similar to 3d IC 3, but illustrates a different example configuration of connection pads 682, 680. Like reference numbers in the figures denote like components, and for brevity, descriptions will not be unnecessarily repeated for FIG. 6A. 3d IC 6 includes I/O circuit 620. The input/output circuitry of I/O Circuit 620 includes receiver 624, level shifter circuit 625, pre-driver circuit 626, post-driver circuit 622 and ESD protection circuit 623. For clarity, FIG. 6B shows I/O circuit 620 without the remaining components of 3d IC 6 shown in FIG. 6A.

Figure 7:
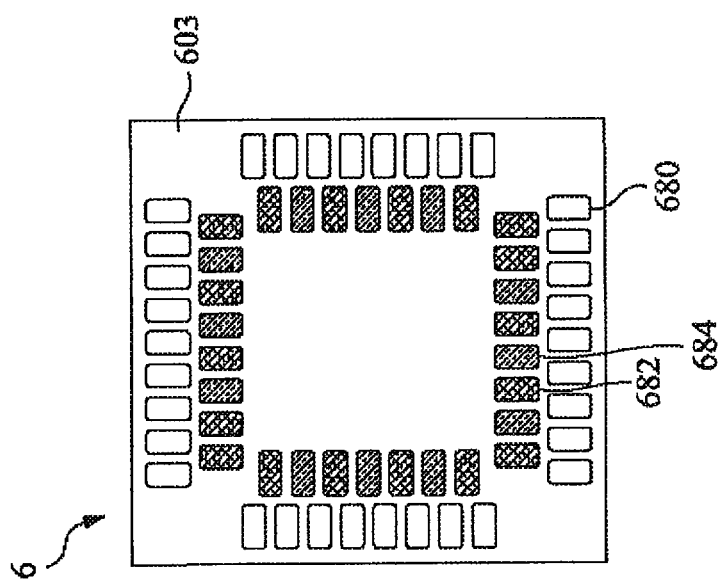
FIG. 7 is a plan diagram showing an example pad layout for the embodiment shown in FIG. 6.

FIGS. 6A and 7 show an example pad layout for 3d IC 6 suitable for bond-wire type packaging. 3d IC 6 has a second set of pads 682 disposed on the top of layer die 603. As shown in FIG. 7, connection pads 680 are disposed along a peripheral area of layer die 603. Connection pads 680 provide connections for power, ground, and high speed I/O for layer die 603. Connection pads 682 provide connections for power and ground to logic 610 of layer die 601. Connection pads 682 alternate with connection pads 684 and are disposed inward of connection pads 680. Connection pads 684 provide connections for power, ground and low speed I/O for layer die 602. An advantageous aspect of this layout is that high speed I/O is provided by connection pads 680 that are disposed outward of low speed I/O provided by connection pads 684. The configuration results in lower parasitic effects and less signal degradation for the high speed I/O. The arrangement of connection pads 682, 680 can be applied to other embodiments disclosed herein, including to 3d IC 3.

Figure 8:
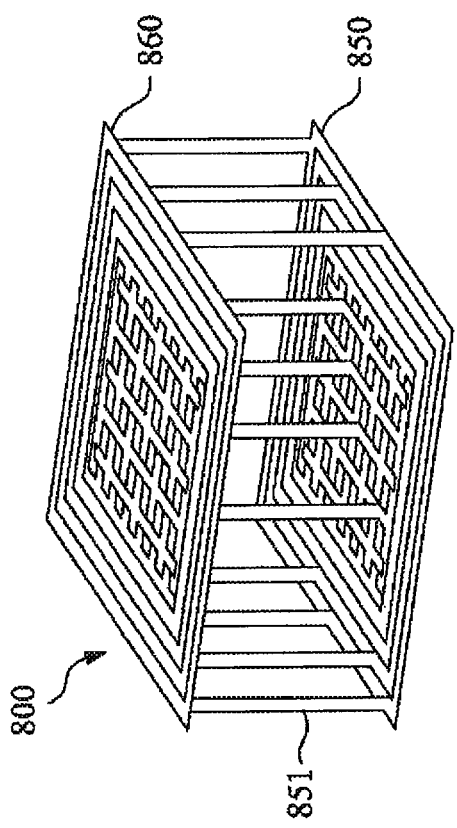
FIG. 8 is a side perspective view showing an embodiment of a power and ground distribution network useable with the 3d IC of FIG. 1.

FIG. 8 shows an embodiment of power and ground (P/G) distribution network 800 for use with a 3d IC, such as some embodiments of 3d IC 1. P/G distribution network 800 has a lower layer 850 interconnected by connections 851 with upper layer 860. There are many ways of implementing connections 851 within the scope of the disclosure, including utilizing TSVs or ILVs, such as interconnections 171, 172, 173, 174 shown in FIG. 1, or other, not shown, TSVs, ILVs or interconnections. Advantageously, the resulting three dimensional nature of P/G distribution network 800 accommodates the 3d IC embodiments disclosed, such as 3d IC 1. P/G distribution network 800 provides power and ground at two levels. In some embodiments, one of these levels is defined for the core devices used, for example, in layer die 101 of 3d IC 1. In some embodiments, the second of these levels is defined for input output functions, for example, the power and ground levels used for the I/O devices embodied in layer die 101, including receiver circuit 124, level shifter circuit 125 and pre-driver circuit 126. P/G distribution network 800 allows the use of both core devices and I/O devices on each layer die, for example, layer die 101 of 3d IC 1. The lower layer 850 and upper layer 860 of P/G distribution network 800 are further described with respect to FIGS. 9 and 10, respectively.

Figure 9:
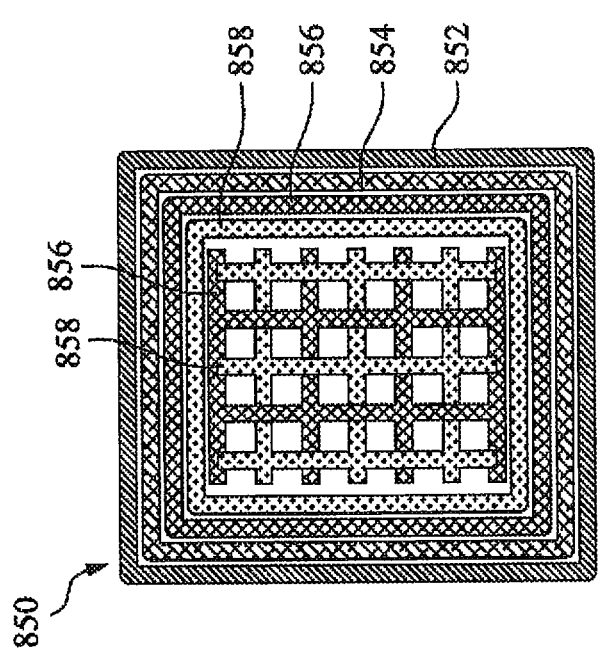
FIG. 9 is a plan diagram showing an example lower layer mesh for the power and ground distribution network of FIG. 8.

FIG. 9 shows lower layer 850 of P/G distribution network 800. Outer ring 852 provides ground at the I/O ground level. Ring 854 provides power at the I/O power level. In some embodiments, the I/O power level is specified with a voltage difference at a level less than 2 V, such as 1.2 V or 1.8 V. The particular I/O voltage difference used to power I/O devices is typically specified by the semiconductor process node used. In the example of FIG. 1A, rings 854, 852 provide power and ground, respectively, to I/O devices embodied in layer die 101, including receiver circuit 124, level shifter circuit 125 and pre-driver circuit 126. Ring and mesh 856 provide ground at the level defined for core devices, for example, to the core devices used for logic 110 on layer die 101. Ring and mesh 858 provide power at the level defined for core devices, for example, to the core devices used for logic 110 on layer die 101. In some embodiments, the voltage difference for powering core devices is specified at a level less than 1 Volt, such as about 0.9 V or 0.8 V. The particular I/O voltage difference used to power core devices is typically specified by the semiconductor process node used. Other circuitry implemented using core devices would also receive power and ground at the core level provided by rings and meshes 856, 858, including embodiments in which core devices are used to implement any of I/O circuitry receiver 124, level shifter circuit 125 or pre-driver circuit 126 on layer 101.

Figure 10:
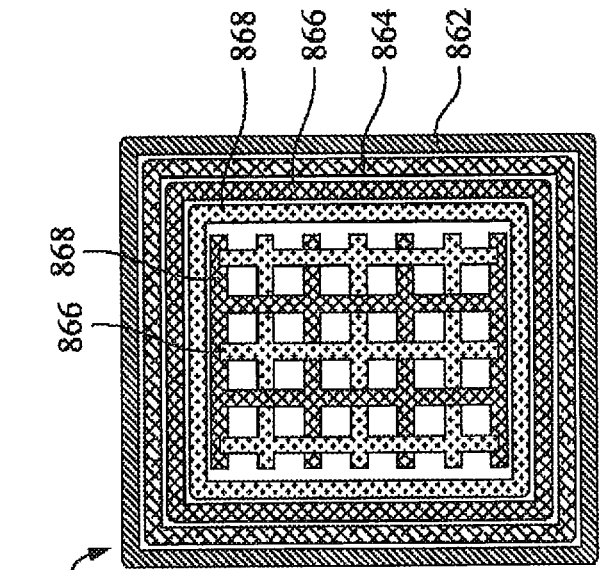
FIG. 10 is a plan diagram showing an example upper layer mesh for the power and ground distribution network of FIG. 8.

FIG. 10 shows upper layer 860 of the P/G distribution network 800. Upper layer 860 provides core level power via ring and mesh 868 and core level ground via ring and mesh 866. Upper layer 860 provides I/O level power via ring 864. Upper layer 860 provides I/O level ground via ring 862. Upper layer 860 is suitable for embodiments of a 3d IC having an upper layer die that includes both core devices and I/O devices, such as some embodiments of layer die 102 of 3d IC 1.

FIG. 11A shows an embodiment of 3d IC 11. 3d IC 11 is similar to 3d IC 6, except that 3d IC 11 provides a different example configuration of connection pads 1180, 1181, and 1182. Like reference numbers in the figures denote like components, and for brevity, descriptions will not be unnecessarily repeated for FIG. 11A. 3d IC 11 includes I/O circuit 1120. The input/output circuitry of I/O Circuit 1120 includes receiver 1124, level shifter circuit 1125, pre-driver circuit 1126, post-driver circuit 1122 and ESD protection circuit 1123. For clarity, FIG. 11B shows I/O circuit 1120 without the remaining components of 3d IC 11 shown in FIG. 11.

Figure 12:
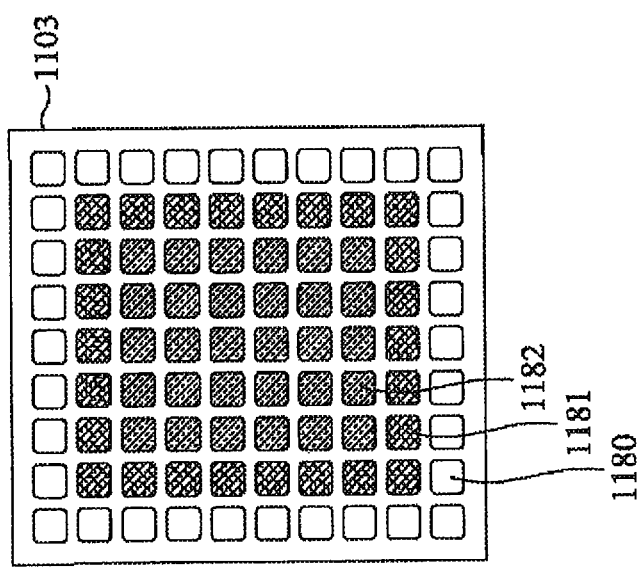
FIG. 12 is a plan diagram showing an example pad layout for the embodiment shown in FIG. 11.

FIGS. 11 and 12 show an example layout of connection pads 1180, 1181, and 1182 for 3d IC 11 that is suitable for flip-chip packaging. Consistent with flip-chip packaging, connection pads 1180, 1181, and 1182 utilize significant areas of layer die 1103 to provide an increased number of I/O connections to I/O circuit 1120. Connection pads 1180, 1181, and 1182 Pads 1180 provide high speed I/O and power and ground for layer die 1103. Pads 1181 provide low speed I/O and power and ground for layer die 1102. Pads 1182 provide core device level power and ground for layer die 1101. An advantageous aspect of this layout is that high speed I/O is provided by connection pads 1180 that are disposed outward of low speed I/O provided by connection pads 1181. The configuration results in lower parasitic effects and less signal degradation for the high speed I/O signals. The arrangement of connection pads 1180, 1181, and 1182 can be applied to other embodiments disclosed herein.

FIG. 13 is a top perspective view of power and ground distribution network 1300 suitable for 3d IC embodiments in which a given layer die uses one level of power and one level of ground, such as some embodiments of 3d IC 2. Power and ground distribution network 1300 has an upper layer 1360 and a lower layer 1350. Like reference numbers in the figures denote like components, and for brevity, descriptions will not be unnecessarily repeated here. FIG. 14 shows lower layer 1350 of power and ground distribution network 1300 of FIG. 13. Lower layer 1350 has core power mesh 1356 and core ground mesh 1354. FIG. 15 shows an upper layer 1360 of power and ground distribution network 1300 of FIG. 13. Upper layer 1360 has I/O power mesh 1364 and I/O ground mesh 1362.

Power and ground distribution network 1300 is suitable for 3d IC embodiments in which a given layer die advantageously uses one level of power and one level of ground. For example, in some embodiments of 3d IC 2, the transistors of layer die 201 are implemented using core devices, resulting in that layer using core device level power and ground, but not I/O level power and ground. Likewise, in some embodiments, layer die 202 can be implemented using I/O level power and ground, without core device power and ground. Likewise, the I/O power mesh 1364 and I/O ground mesh 1362 of upper layer 1360 is suitable to supply power to the following layer die when implemented in embodiments without core devices: 102 of FIG. 1A; 302 and 303 of FIG. 3A; 402 of FIG. 4A; 502, 503 and 504 of FIG. 5A; 602 and 603 of FIG. 6A; and 1102 and 1103 of FIG. 11A. Because each layer 1350, 1360 carries one power level and one ground level, each layer can have better ESD, current and resistance profiles ("IR") and EM properties. Generally, improved IR refers to lower current or smaller resistance, with an associated decreased voltage drop and improved circuit performance. In some embodiments, because each layer 1350, 1360 provides one set of power and ground levels, the layers 1350, 1360 can have wider and thicker bus metal, which provides better IR and EM performance due to the smaller resistance and larger current density tolerance.

FIG. 16 shows flow diagram 1600 illustrating process steps for making some embodiments of a 3d IC. For illustrative purposes, reference is made here to the 3d IC 2 of FIG. 2A, but the process steps could be used for other 3d IC embodiments. Step 1610 is directed to designing a logic circuitry layout for a first layer die of a 3d IC. In the example of FIG. 2A, that includes designing a layout for circuitry in logic circuit 210 of layer die 201. Designing can include a variety of activities, including, for example, selecting a pre-existing design, modifying a pre-existing design, or creating the detailed design for the first time. Step 1620 is directed to designing a circuit layout for input output circuitry for another layer die of the 3d IC. With respect to the example of FIG. 2A, step 1620 includes designing a layout for I/O circuitry 224, 225 and/or 226 for layer die 202 based on the process node characteristics of layer die 202. Step 1630 is directed to fabricating the 3d IC in accordance with the designed layouts for the input output circuitry and logic circuitry. Referring to FIG. 2A, fabrication includes manufacturing layer dies 201 and 202 using the respective designed layouts, together with additional layout design details, such as power and ground networks or other further circuitry.

FIG. 17 is a block diagram of a system 1700 for providing layouts and performing the circuit designs according to one embodiment. Processor 1702 is configured to execute one or more application programs. Additional processors (not shown) can also be used. Similarly, two non-transitory machine readable storage media 1706 and 1708 are shown, but the data may be stored in any number of media. Examples of non-transient computer readable storage mediums 1706, 1708 include, but are not limited to, hard disk drives (HDD), read only memories ("ROMs"), random access memories ("RAMs"), flash memories, or the like.

System 1700 includes an electronic design automation ("EDA") tool such as "IC COMPILER"™, which includes a place and route tool 1704, such as "ZROUTE"™, both sold by Synopsys, Inc. of Mountain View, Calif. Other EDA tools may be used. The EDA tool is a special purpose computer formed by retrieving stored program instructions from a non-transient computer readable storage medium 1706 and executing the instructions on processor 1702. Tangible, non-transient machine readable storage mediums 1706, 1708 are configured to store data generated by the place and route tool 1704. The place and route tool 1704 is capable of receiving an identification of a plurality of cells to be included in a circuit layout. Tool 1704 may be equipped with a set of default design rules 1722 and technology file 1724.

In some embodiments, a graphical interface facilitates the design process by displaying the design layout or portions of the layout, such as those described above on a display 1730. The display 1730 allows the viewing and selection of the main function blocks (e.g., IP blocks) to be included in a single layer. System 1700 designs circuitry layouts 1718 based on the selections. Circuitry layouts 1718 are then stored in a non-transitory machine-readable storage medium 1708.

In some embodiments, designing a new 3d IC can involve modifying circuitry layouts 1718 previously developed in connection with a pre-existing 3d IC product. For example, design step 1610 can be used as part of a product update where a first layer die 201 in a new 3d IC 2 uses a process node with a higher gate density than a previous version of the product embodied in a pre-existing IC. As part of the update, the logic circuitry for the old IC product can be redesigned (ported or migrated) to a more advanced process node to achieve benefits in size, power consumption, speed and the like. In other embodiments, there is no relation between the logic circuit 210 of the new 3d IC 2 and the logic circuit in the pre-existing product. Creating the new design can involve adapting a circuitry layout 1718 for logic 210 to a more advanced process node, such as higher gate density, or to using new logic altogether. In some embodiments, the designing step 1620 can include using a selected portion of a previously designed circuitry layout 1718 for input output circuitry that was designed in connection with a pre-existing product, e.g., one that existed prior to designing the new three-dimensional integrated circuit. Referring to FIG. 2A, for example, the designing can include re-using selected portions of a previously designed circuitry layout 1718 for I/O circuitry 224, 225 and/or 226 for layer die 202. In some embodiments, the selected portion that is re-used is substantially all of the previously designed circuitry layout 1718 for the I/O circuitry 224, 225 and 226. For example, minor modifications may be made to a previously designed I/O circuitry layout 1718, such as to accommodate TSVs, ILVs and other requirements unique to new layer die 201 and logic circuit 210. In some embodiments, the selected portions of the prior I/O circuitry can be re-used in its entirety, without modification. In this way, an existing design of stacked layer dies can be updated and improved efficiently. For example, a first layer die can be ported to a higher gate density process node while maintaining portions of I/O circuitry on a lower gate density process node that is more suitable for those portions of the I/O circuitry. FIG. 18 shows flow diagram 1800 illustrating process steps for using embodiments of a 3d IC. For illustrative purposes, reference is made to 3d IC 2 of FIG. 2A, but the process steps are readily adaptable to variations of the 3d IC embodiments. In step 1810, the 3d IC is energized with electrical power. For example, power and ground distribution network 1300 of FIG. 13 can be used to energize 3d IC 2. In step 1820, logic 210 of 3d IC 2 generates an electronic signal according to the function of logic 210. For example, in a cellular device, the electronic signal could be a low power data signal that will be used to form a cellular transmission signal. In step 1830, the electronic signal is provided to I/O circuit 220. For example, the electronic signal would pass through interconnection 271 or 274 to reach receiver circuit 224 of I/O circuit 220 on layer die 202. In step 1840, the signal is passed through the I/O circuit 220, including circuitry embodied in layer die 202, to pad 280. In step 1850, the electronic signal is coupled from pad 280 onward toward an electronic component (not shown) external to 3d IC 2. In step 1860, the signal is received and processed in the external component. For example, if the logic circuit 210 of 3d IC 2 generates an electronic signal representing data to be transmitted as a radio frequency ("RF") signal, then the external electronic component could be the RF radio circuit that processes that data signal to form a signal suitable for transmission. As will be appreciated by one of ordinary skill in the art, corresponding signal paths can exist in the other direction as well, i.e., from an external component to the logic circuitry via the I/O circuitry.

Compared to alternative techniques, various embodiments allow disposing at least the post-driver circuit and ESD protection circuits on an upper layer and using a more mature process node for that die, at a lower cost. Doing so also reduces the resources required for designing and verifying post-driver and ESD protection circuits, because the designs can be reused. Additionally, the more mature process node can provide better EM, leakage and ESD performance, typically more suitable for the design needs of the post-driver circuit and/or ESD protection circuit of an I/O circuit of a 3d IC.

In certain aspects and embodiments, three-dimensional integrated circuits, methods of using three-dimensional integrated circuits, and methods of making three-dimensional integrated circuits are disclosed.

In a first aspect, disclosed are three-dimensional integrated circuits, including a first layer, a second layer electrically coupled to the first layer and disposed in a stacked relationship relative to the first layer. The three-dimensional integrated circuit further includes logic circuitry embodied in the first layer, and input output circuitry of an input output circuit adapted to electrically couple the logic circuitry to a component external to the three-dimensional integrated circuit. The input output circuitry is embodied in the second layer.

In a second aspect, disclosed are methods of using a three-dimensional integrated circuit, including providing electrical power to the three-dimensional integrated circuit and generating an electronic signal in logic circuitry embodied in a first layer of the three-dimensional integrated circuit. The methods include providing the electronic signal to an input output circuit of the three-dimensional integrated circuit and passing the electronic signal through the input output circuit, including through at least input output circuitry embodied in a second layer of the three-dimensional integrated circuit. The electronic signal is sent from the input output circuit to a component external to the three-dimensional integrated circuit and then received and processed in the external component.

In a third aspect, disclosed are methods for making a three-dimensional integrated circuit having a first layer in a stacked relationship with a second layer. The methods include designing a logic circuitry layout for the first layer and designing an input output circuitry layout for the second layer of the three-dimensional integrated circuit. The input output circuitry is part of an input output circuit of the three-dimensional integrated circuit. The three-dimensional integrated circuit is fabricated in accordance with the designed layouts.

In some embodiments, the step of designing an input output circuitry layout further includes using a selected portion of a previously designed layout for input output circuitry that was designed in connection with a product that existed prior to designing the three-dimensional integrated circuit. In some embodiments, the selected portion is substantially all of the previously designed layout. In some embodiments, the first layer is implemented using a first process node that is different from a second process node of the pre-existing product and the step of designing a logic circuitry layout for the first layer includes porting logic circuitry from the existing product to the first process node of the first layer.

In some embodiments, the input output circuitry embodied in the second layer comprises a post-driver circuit. In some embodiments, the input output circuitry embodied in the second layer comprises an electrostatic discharge protection circuit. In some embodiments, the first layer comprises components of the input output circuit selected from at least one of: a level shifter circuit, a pre-driver circuit or a receiver circuit.

In some embodiments, the first layer is implemented using a process node that is different from a process node of the second layer. In some embodiments, the first layer has a higher gate density than the second layer.

In some embodiments, the transistors of the first layer consist of core devices.

In some embodiments, the input output circuitry is adapted to operate between a high power level and a ground level, and the three-dimensional integrated circuit has a power and ground network that is adapted to provide only the high power level and the ground level to the second layer.

In some embodiments, the second layer further comprises a decoupling capacitive device disposed intermediate two areas of the second layer, the two areas embodying respective portions of the input output circuitry.

In some embodiments, the first layer and the second layer are part of a stack of three or more dies.

In some embodiments, the input output circuitry has a standard component design useable with other three dimensional integrated circuits with different logic circuitry.

In some embodiments, the three dimensional integrated circuit further includes a memory stack electrically coupled to the second layer.

In some embodiments, the passing of the electronic signal further includes passing the electronic signal through a post-driver circuit embodied in the second layer. In some embodiments, the electronic signal is generated according to the characteristics of the process node of the first layer, the first layer having a higher gate density than the second layer. In some embodiments, the three-dimensional integrated circuit has a plurality of stacked dies, the plurality being at least three dice, and the electronic signal passes through less than all of the plurality of stacked dice.

In some embodiments, the input output circuitry is operable between a high power level and a ground level and the providing electrical power step further comprises providing the second layer with only the high power level and the ground level.

The methods and system described herein may be at least partially embodied in the form of computer-implemented processes and apparatus for practicing those processes. The disclosed methods may also be at least partially embodied in the form of tangible, non-transitory machine readable storage media encoded with computer program code. The media may include, for example, RAMs, ROMs, CD-ROMs, DVD-ROMs, BD-ROMs, hard disk drives, flash memories, or any other non-transitory machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those of ordinary skill in the art.

What is claimed is:

1. A method of making a three-dimensional integrated circuit, the method comprising:
   forming a first layer having circuitry embodied therein that is adapted to operate between a first ground level and a first power level;
   forming a second layer electrically coupled to said first layer and disposed in a stacked relationship relative to said first layer, and wherein circuitry embodied in said second layer is adapted to operate between a second ground level and a second power level different from said first power level; and
   forming a power and ground distribution network including a first conductive structure for said first layer adapted to provide said first power level to said first-layer-embodied circuitry and a second conductive structure for said second layer adapted to provide said second power level to said second-layer-embodied circuitry.

2. The method of claim 1, wherein the first conductive structure includes a conductive mesh and the second conductive structure is a ring.

3. The method of claim 1, wherein the first-layer-embodied circuitry comprises logic circuitry having one or more transistors and first input output circuitry of an input output circuit that is electrically coupled to said logic circuitry, and wherein the second-layer-embodied circuitry comprises second input output circuitry of said input output circuit.

4. The method of claim 3, wherein said first input output circuitry comprises a first receiver circuit, a first level shifter circuit, and a first pre-driver circuit.

5. The method of claim 3, wherein said second input output circuitry comprise a post-driver and an electrostatic discharge protection circuit.

6. The method of claim 3, wherein said first input output circuitry is adapted to provide input to and output from said logic circuitry at a first speed, and said second input output circuitry is adapted to provide input to and output from said logic circuitry at a second speed that is different than the first speed.

7. The method of claim 6, wherein said first speed is faster than said second speed.

8. The method of claim 7, further comprising:
forming first connection pads disposed on an external surface of said three-dimensional integrated circuit for providing said input and output at said first speed; and
forming second connection pads disposed on said external surface, and outward of said first connection pads, for providing said input and output at said second speed.

9. A method of forming a three-dimensional integrated circuit, the method comprising:
forming logic circuitry having one or more transistors and embodied in a first layer of said three-dimensional integrated circuit;
forming an input output circuit electrically coupled to said logic circuitry and having a plurality of transistors embodied in at least one layer of said three-dimensional integrated circuit, said input output circuit comprising:
first input output circuitry adapted to operate at a first speed, and
second input output circuitry adapted to operate at a second speed that is slower than said first speed.

10. The method of claim 9, wherein said first input output circuitry includes a plurality of transistors embodied in said first layer.

11. The method of claim 10, wherein said first input output circuitry comprises a first receiver circuit, a first level shifter circuit, and a first pre-driver circuit.

12. The method of claim 9, wherein said plurality of layers comprises said first layer, a second layer and a third layer; said first input output circuitry includes a plurality of transistors embodied in said third layer; and said second input output circuitry includes a plurality of transistors embodied in said second layer.

13. The method of claim 12, wherein said first input output circuitry further includes a plurality of transistors embodied in said first layer.

14. The method of claim 12, wherein said plurality of transistors of said first input output circuitry embodied in said third layer comprise a first post-driver and a first electrostatic discharge protection circuit; and said plurality of transistors of said second input output circuitry embodied in said second layer comprise a second post-driver and a second electrostatic discharge protection circuit.

15. The method of claim 9, further comprising
forming a first plurality of connection pads disposed on an external surface of said three- dimensional integrated circuit and coupled to said first input output circuitry to provide connectivity at said first speed; and
forming a second plurality of connection pads on said external surface of said three- dimensional integrated circuit and coupled to said second input output circuitry to provide connectivity at said second speed,
wherein said first plurality of connection pads is disposed along a peripheral area of said external surface outward of said second plurality of connection pads.

16. The three-dimensional integrated circuit of claim 15, wherein said plurality of layers comprises said first layer, a second layer and a third layer; said first input output circuitry includes a plurality of transistors embodied in said third layer coupled to said first plurality of connection pads; and said second input output circuitry includes a plurality of transistors embodied in said second layer coupled to said second plurality of connection pads.

17. A method of using a three-dimensional integrated circuit, the method comprising:
providing electrical power to said three-dimensional integrated circuit;
generating a first signal in logic circuitry embodied in a first layer of said three- dimensional integrated circuit;
providing said first signal to first input output circuitry of said three-dimensional integrated circuit;
outputting, at a first speed, said first signal from said input output circuitry to a component external to said three-dimensional integrated circuit;
receiving and processing said first signal in said external component;
generating a second signal in said logic circuitry embodied in said first layer of said three-dimensional integrated circuit;
providing said second signal to said second input output circuitry of said three- dimensional integrated circuit;
outputting, at a second speed, said second signal from said second input output circuitry, wherein the second speed is different from the first speed; and
receiving and processing said second signal external to said three-dimensional integrated circuit.

18. The method of claim 17, wherein said first input output circuitry includes a plurality of transistors embodied in said first layer.

19. The method of claim 17, wherein said first input output circuitry comprises a first receiver circuit, a first level shifter circuit, and a first pre-driver circuit.

20. The method of claim 17, wherein said three-dimensional integrated circuit comprises said first layer, a second layer and a third layer; said first input output circuitry includes a plurality of transistors embodied in said third layer; and said second input output circuitry includes a plurality of transistors embodied in said second layer.

21. The method of claim 20, wherein said first input output circuitry further includes a plurality of transistors embodied in said first layer.

* * * * *